(12) United States Patent
Ventzek et al.

(10) Patent No.: US 9,165,771 B2
(45) Date of Patent: Oct. 20, 2015

(54) PULSED GAS PLASMA DOPING METHOD AND APPARATUS

(71) Applicant: TOKYO ELECTRON LIMITED, Tokyo (JP)

(72) Inventors: Peter Ventzek, Austin, TX (US); Takenao Nemoto, Sendai (JP); Hirokazu Ueda, Miyagi (JP); Yuuki Kobayashi, Kurokawa (JP); Masahiro Horigome, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/244,481

(22) Filed: Apr. 3, 2014

(65) Prior Publication Data

US 2014/0302666 A1 Oct. 9, 2014

Related U.S. Application Data

(60) Provisional application No. 61/808,321, filed on Apr. 4, 2013.

(51) Int. Cl.
*H01L 21/223* (2006.01)
*H01J 37/32* (2006.01)
(Continued)

(52) U.S. Cl.
CPC ......... *H01L 21/2236* (2013.01); *H01J 37/3244* (2013.01); *H01J 37/32412* (2013.01); *H01J 37/32449* (2013.01); *H01L 29/66803* (2013.01)

(58) Field of Classification Search
CPC ...... H01L 21/265; H01L 21/31; H01L 21/311
USPC .................. 438/106, 513, 710, 658; 257/766, 257/E21.249, E29.146; 118/696
See application file for complete search history.

(56) References Cited

U.S. PATENT DOCUMENTS 6,383,954 B1 5/2002 Wang et al.
6,821,910 B2 11/2004 Adomaitis et al.
(Continued)

FOREIGN PATENT DOCUMENTS

JP 2000294538 A * 10/2000 .......... H01L 21/3065
WO 2011/161965 A1 12/2011

OTHER PUBLICATIONS

Fuse et al., "Feasibility Study of Plasma Doping using B2H6 and PH3 for Shallow Junction", Ext. Abs. the 11th International Workshop on Junction Technology 2011, 978-1-61284-134-2/11.*

(Continued)

*Primary Examiner* — Kimberly Rizkallah
*Assistant Examiner* — Brian Turner
(74) *Attorney, Agent, or Firm* — Rothwell, Figg, Ernst & Manbeck, P.C.

(57) ABSTRACT

A method and apparatus for doping a surface of a substrate with a dopant, with the dopant being for example phosphine or arsine. The doping is performed with a plasma formed primarily of an inert gas such as helium or argon, with a low concentration of the dopant. To provide conformal doping, preferably to form a monolayer of the dopant, the gas flow introduction location is switched during the doping process, with the gas mixture primarily introduced through a center top port in the process chamber during a first period of time followed by introduction of the gas mixture primarily through peripheral or edge injection ports for a second period of time, with the switching continuing in an alternating fashion as the plasma process.

20 Claims, 6 Drawing Sheets

(51) Int. Cl.
*H01L 21/265* (2006.01)
*H01L 21/66* (2006.01)
*H01L 29/66* (2006.01)

(56) References Cited

U.S. PATENT DOCUMENTS

| | | | |
|---|---|---|---|
| 7,932,181 B2 | 4/2011 | Singh et al. | |
| 7,939,447 B2 | 5/2011 | Bauer et al. | |
| 8,003,503 B1 | 8/2011 | Clark | |
| 8,133,349 B1 | 3/2012 | Panagopoulos | |
| 8,343,876 B2 | 1/2013 | Sadjadi et al. | |
| 2001/0054601 A1 | 12/2001 | Ding | |
| 2002/0168853 A1* | 11/2002 | Maa et al. | 438/655 |
| 2004/0245091 A1 | 12/2004 | Karim et al. | |
| 2005/0221020 A1 | 10/2005 | Fukiage | |
| 2008/0200015 A1 | 8/2008 | Miller et al. | |
| 2009/0130335 A1* | 5/2009 | Okumura et al. | 427/569 |
| 2009/0233427 A1* | 9/2009 | Sasaki et al. | 438/513 |
| 2010/0041207 A1 | 2/2010 | Lee et al. | |
| 2010/0264117 A1* | 10/2010 | Ohmi et al. | 216/67 |
| 2011/0183508 A1 | 7/2011 | Chan et al. | |
| 2011/0272763 A1* | 11/2011 | Sasaki et al. | 257/347 |
| 2011/0303146 A1* | 12/2011 | Nishijima et al. | 118/708 |
| 2012/0256238 A1 | 10/2012 | Ning et al. | |

OTHER PUBLICATIONS

Applied Materials, "Conforma Plasma Doping System, Breakthrough Technology for Building 3D Transistors", Silicon Systems Group, Mar. 16, 2011, 16 pages.

International Search Report and Written Opinion mailed Aug. 22, 2014 in PCT/US2014/032814 (12 pages).

Suzuki, et al., "Resistivity of Heavily Doped Polycrystalline Silicon Subjected to Furnace Annealing," Jpn. J. Appl. Phys. Vo. 34 (1995) pp. 1748-1752, Part 1, No. 4A, Apr. 1995 (5 pages).

Steen, et al., "Distribution and segregation of arsenic at the SiO2/Si interface," Journal of Applied Physics 104, 023518 (2008) pp. 0235181-023518-11 (11 pages).

Sasaki, et al., "Production-Worthy USJ Formation by Self-Regulatory Plasma Doping Method," CP866, Ion Implanation Technology, 2006 American Institute of Physics pp. 524-527 (4 pages).

Elsevier Science Ltd., "Dopants in Silicon Activation and Deactivation Kinetics," Encyclopedia of Materials: Science and Technology ISBN: 0-08-0431526 (9 pages).

Yuichiro Sasaki, "Sidewall resistance reduction for FinFETs by B2H6/Helium Self-Regulatory Plasma Doping Process," Ultimate Junction Technologies Inc., 2010 IEEE (4 pages).

Berding, et al., "Electronic quasichemical formalism: Application to arsenic deactivation in silicon," Physical Review B, vol. 58, No. 7, Aug. 15, 1998-I, 1998 The American Physical Society, pp. 3853-3864 (12 pages).

Sasaki, et al., "B2H6 Plasma Doping with In-situ He Pre-amorphization," Ultimate Junction Technologies Inc., 2004 Symposium on VLSI Technology Digest of Technical Papers (2 pages).

Sasaki, et al, "Conformal Doping for FinFETs and Precise Controllable Shallow Doping for Planar FET Manufacturing by a Novel B2H6/Helium Self-Regulatory Plasam Doping Process," Ultimate Junction Technologies Inc., 2008 IEEE, pp. 917-920 (4 pages).

Sasaki, et al., "Conformal Doping for FinFETs by a Novel Self-Regulatory Plasa Doping Process," Ultimate Junction Technologies Inc., 2010 International Symposium on Dry Process, (2 pages).

Olesinski, et al., "The P-Si (Phosphorus-Silicon) System," University of Florida, Bulletin of Alloy Phase Diagrams vol. 6, No. 1985, pp. 130-133 (4 pages).

Scotten W. Jones, "Diffusion in Silicon," ICKnowledge LLC, Apr. 25, 2008 (71 pages).

Iacona, et al., "Arsenic redistribution at the SiO2/Si interface during oxidation of implanted silicon," Physical Review B, vol. 58, No. 16, Oct. 15, 1998-II, 1998 The American Physical Society, pp. 10 990-10 999 (10 pages).

* cited by examiner

PULSED GAS PLASMA DOPING METHOD AND APPARATUS

CROSS REFERENCE TO RELATED APPLICATIONS

This application claims priority to provisional application 61/808,321 filed Apr. 4, 2013, the entirely of which is incorporated herein by reference.

TECHNICAL FIELD

The invention relates to plasma doping, and particularly to a method and apparatus for doping the surface of a substrate. The invention is particularly advantageous in doping a silicon substrate having topographic structures such as fin shaped structures formed thereon.

BACKGROUND OF THE INVENTION

Doping refers to the insertion of atoms into a substrate to achieve a change in the substrate material properties. The properties can include, e.g., electrical mobility, index of refraction, surface reactivity, mechanical properties or more specifically electrical band structure. The most common application of doping is the implant of donor and acceptor species into electrical devices such as gate sources and drains. The process of doping can include an atom infusion step followed by an electrical activation step including the application of heat. Plasma doping is an alternative to low energy ion implantation for the doping of fin structures or other non-planar electrical structures on semiconductor substrates being processed. Electron cyclotron resonance (ECR) plasma and inductively coupled plasma (ICP) plasmas have been used for plasma doping. More recently, microwave plasma sources, particularly surface wave based plasma sources have been used for plasma doping. Typically, plasma doping sources employ center and edge gas injection. This central or peripheral gas injection is employed because using gas injection from showerheads opposite the wafer/substrate is difficult to implement in ECR, ICP, or microwave driven sources.

In doping a substrate, problems can arise in providing conformal or uniform doping across the substrate such as where the surface of the substrate is non-uniformly saturated with dopant across the substrate surface. In certain areas excessive amounts of the dopant can be infused which can cause the dopant species to form clusters. Here, clusters refers to bonded multi-atom (>2) groups of dopant atoms formed on the substrate. Clusters may also be comprised of dopant atoms and other atoms such as oxygen. If clusters of the dopant were formed, they could easily be removed or sublimated after deposition when the substrate is annealed as they become volatile at low temperatures (e.g., about 460 C for Arsenic doping). The consequence is loss of dopant in localized regions and the surface resistivity of the substrate will be non-uniform across the substrate. In addition, if certain areas are insufficiently doped, the surface resistivity of the substrate will be non-uniform across the substrate. Further, certain doping techniques can result in excessively high ion energies, which can undesirably damage features formed on the substrate that are being doped. For example high energy ions can damage the corners of a Fin-FET (fin-like field effect transistors), or excessively penetrate into the substrate creating damaged material (silicon fin or gate structures). Although cleaning steps can remove some damage, excessive damage can exceed amounts that will be removed in cleaning steps, e.g., as used as part of masking n and p (donor and acceptor) regions of die.

Doping of non-planar surfaces is also challenging in part because of poor view factors or geometries. Conformal plasma doping typically uses a dopant flux with an isotropic angular distribution incident on the plane of the wafer or dopant flux with an anisotropic angular distribution typically at 30-45 degrees to the surface normal. For example, with conventional 30-45 degree implantation, equal fluxes of dopant are incident on vertical and horizontal surfaces. This is adequate for structures that are perfectly vertical and horizontal and with vertical surfaces that are not shadowed by neighboring vertical surfaces. Surfaces abutting valleys of aspect ratios greater than one or that are adjacent to relatively tall structures, however, receive relatively few dopants. Examples of these structures include Fin-FET devices, vertical NAND Flash memory structures, and CMOS image sensors. In addition, many structures are not planar and do not possess topographies normal or parallel to the substrate. Examples of these structures include image sensors, photonic devices with raised cylindrical structures, silicon nanowires or gate structures with recesses.

SUMMARY OF THE INVENTION

The invention provides an advantageous method and apparatus for doping the surface of a substrate having structures formed thereon. The invention is particularly advantageous for doping a surface having fin structures such as FinFET devices, however, the invention can also be used for other doping applications. According to a preferred form, a gas mixture is introduced in an alternating fashion between introduction from a central location or center injection port (or ports) and peripheral introduction by way of plural gas introduction ports located at the periphery of the chamber. More particularly, according to an example of the invention, during a first time period, a gas mixture including primarily an inert gas (such as helium, hydrogen or argon) and a dopant gas (preferably a gas containing phosphine or arsine) is injected through a central injection port located at the top of the process chamber. Thereafter, the flow is essentially discontinued through the central port at the top of the chamber, and the gas is introduced for a second period of time through the peripheral ports at the side of the chamber. The duration of the first and second periods of time can be the same or different, and preferably should be greater than the average gas flow residence time of the chamber. For example, the first and second periods of time can each be about 0.5-10 seconds, and more preferably about 2-10 seconds. Alternating of the flow continues until the doping process is completed (e.g., about 30-60 seconds for the total process).

According to an example, when the flow is through the central injection port (or ports), the flow is not completely discontinued through the peripheral ports, and similarly, when the flow is through the peripheral ports, the flow is not completely discontinued to the central port. This avoids problems that can occur, for example, with backflow into the ports or deposits forming during the period in which they are not utilized as the primary location for injection. However, the flow through the ports during the time they are not being used as the primarily injection location is preferably kept small, preferably less than 20% of the total flow, more preferably less than 10% of the total flow or less than 5% of the total flow. Preferably, the flow through the non-primary port(s) is just sufficient so as to avoid backflow while also ensuring that the primary flow regime into the chamber is from the port through which the gas mixture is primarily being injected at a given time.

According to a preferred example, microwave energy is utilized to form and maintain the plasma with low plasma potential. The low plasma potential prevents or reduces the possibility of ion induced damage to the substrate. In addition, an RF power source can be applied to the substrate support or lower electrode upon which the substrate is placed during processing so as to provide an RF bias. This arrangement provides low energy ions for advantageous doping, particularly in combination with the alternating gas flow described above and in further detail hereinafter. The ion energy is sufficient, however, to amorphize or randomize the silicon surface of the substrate (with ions of the inert gas) and thereby allow the surface to receive and become saturated with the dopant.

BRIEF DESCRIPTION OF THE DRAWINGS

A more complete appreciation of the invention and the advantages achieved thereby will be understood from the detailed description herein, particular when considering in conjunction with the drawings in which.

DETAILED DESCRIPTION OF PREFERRED EMBODIMENTS

With reference to the drawings, examples of embodiments of the invention will be described. It is to be understood that, although details and advantages of the invention are described with reference to illustrated examples, the invention can be practiced otherwise than as specifically described herein. For example, the invention could be practiced utilizing a subset or subsets of features described herein, and by utilizing certain advantages or benefits but not others. Accordingly, it is to be understood that the invention can be practiced otherwise than as specifically described herein.

Figure 1:
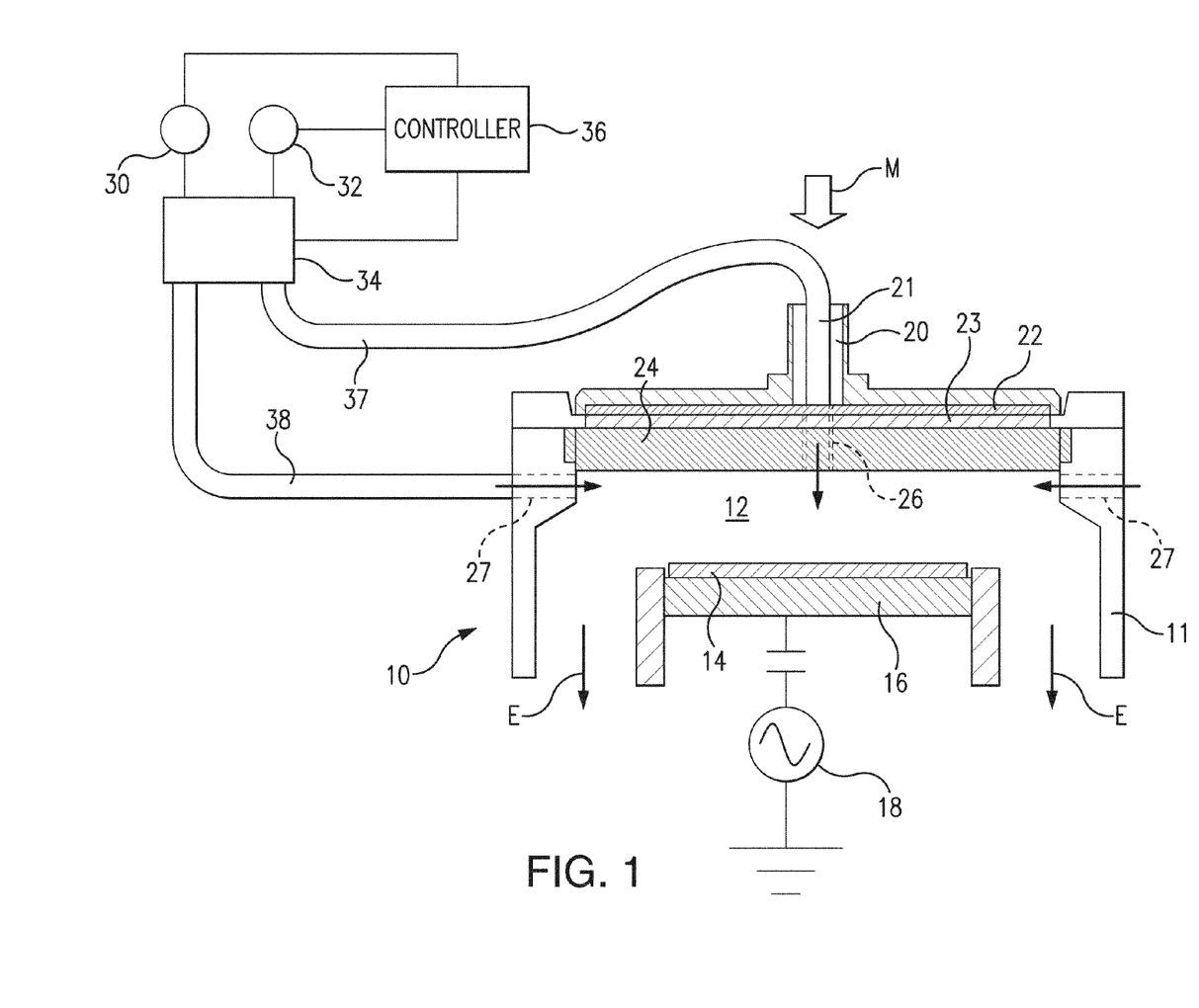
FIG. 1 illustrates an example of a plasma processing chamber which can be used in accordance with the invention.

FIG. 1 illustrates a plasma processing apparatus which can be used in accordance with the present invention. As shown, the arrangement includes a processing chamber 10 enclosing a processing space 12 within which a plasma is generated. A wafer 14 is supported upon a substrate support 16. In a preferred arrangement, a bias, preferably an RF bias is applied by an RF source 18 to the wafer support to provide a bias to the wafer support. However, this power source is not utilized for generating or maintaining the plasma in the preferred form, but rather, is provided as a bias to draw ions toward the wafer. By way of example, the RF bias can have a frequency of 13.56 MHz, however, other frequencies could be utilized. Also, by way of example, the power level of the RF power can be 0-750 watts. The power level can also vary depending upon the power level of the source which generates the plasma, as this will also create a bias on the lower electrode. Thus, for a higher amount of power in generating the plasma, a lower amount of power could be applied to the lower electrode by the RF power source 18. The power used in forming the plasma can also be sufficient to provide a bias on the lower electrode or substrate support, so that a separate application of power for biasing is not needed. For example, a microwave power of equal to or greater than 5000 W could be used without RF power to draw ions to the substrate.

To generate and maintain the plasma, a microwave source supplies microwave energy, illustrated schematically by arrow M, using a microwave source which supplies microwave energy by way of a coaxial wave guide 20, slow wave plate 22, radial line slot antenna 23, and top dielectric plate or quartz window 24, to form the plasma. The frequency of the power source used to generate the plasma could vary, by way of example, frequencies in a range of about 800 MHz to 10 GHz could be used. Gases are fed from supply lines 37, 38 and injected through a central port 26 extending through the top wall or quartz window of the chamber, and through plural peripheral ports 27 extending through the side or peripheral wall 11 of the chamber. In the illustrated example, the coaxial wave guide 20 is hollow and the gas to the port 26 is fed through opening or passageway 21 extending through the wave guide 20 as well as through the slow wave plate 22, slotted antenna 23, and quartz window 24. Alternate feed arrangements could also be utilized so that the center gas introduction need not pass through such structures. It is to be understood that various alternatives could be utilized for the center and/or peripheral injection. For example, instead of a single central port 26, plural central ports could be provided. In addition, although the peripheral ports 27 are illustrated as extending through the side wall of the chamber, in addition to these ports or as an alternative to these ports, it is possible to include peripherally located ports extending through a top region of the chamber, or to utilize a gas injection ring positioned within the chamber to inject the gas mixture into a peripheral region of the plasma processing chamber. In addition, although the peripheral injection locations 27 are at the same radial location with respect to the substrate, the peripheral gas injection could be provided at plural different radial locations to provide an additional control of the gas injection. This could be accomplished by gas injection rings with ports at different radial locations, with injection ports in the top of the chamber at different locations, or using one or more of the foregoing in combination with injection through the side wall. The microwave power can be, e.g., 1 kW to 10 kW for a typical chamber, and further by way of example, power of about 3-5 kW can be used. The power density on the antenna could be, by way of example, 1 W/cm2 to 10 W/cm2 for a planar radial line slotted antenna. The foregoing are preferred ranges, however, other power amounts or power levels could be used.

Preferably, one or more parts of the chamber provide a source of oxygen and silicon during processing, due to their natural or innate composition and consumption during processing. For example, the chamber wall can be coated with yttrium oxide ($Y_2O_3$), and other parts can be formed of silica, for example, a silica window or focus ring, such that silicon and oxygen are present in the plasma during processing. As discussed hereinafter, oxygen (and silicon) can play an advantageous role in processing, however only small amounts are needed, and therefore, oxygen need not be a specific additive of the gas mixture. If desired, small amounts of oxygen could be added to the gas mixture, however because the oxygen requirements are relatively small, a satisfactory contribution of oxygen can be provided by existing chamber parts or selection of chamber parts that provide a source of oxygen and/or silicon.

The gas supply or gas sources are schematically illustrated with one or more gas sources provided at 30, 32. Primarily, the gas mixture will be formed of an inert gas, which is the primary plasma forming gas, such as helium or argon, which can be supplied from a source 30. In addition, a dopant-containing gas is provided, with the dopant preferably arsine or phosphine. Other dopants could be used such as boron-based dopant gas. For example, the dopant-containing gas can include a low concentration of a dopant-hydrogen gas such as $AsH_3$, $B_2H_6$, or $PH_3$, and which is diluted in a carrier gas such as helium. Other dopant gases could also be used such as different fluorides or hydrides of arsenic, phosphorous, or boron, and the foregoing can be provided in monoatomic, diatomic, triatomic or other forms. Cluster ions could also be used such as $B_{10}H_x$ for Boron doping. Cluster ions are bonded multiatom arrangements of dopant species and other atoms generated remote from the substrate and would be introduced into the plasma. Cluster ions can be advantageous in that they have a low energy per cluster atom due to their large mass, and disperse upon impact with a substrate without damaging the substrate. By way of example, the dopant compound can be less two percent, more preferably less than one percent of the dopant containing gas (e.g., 0.7% $AsH_3$, with the remainder He, optionally with small additional additives such as additional hydrogen in the dopant containing gas). Thus, the dopant itself is introduced into the chamber in only very small amounts, particularly compared to the overall gas flow. The amount of dopant introduced in the chamber is greater than the dose requirement to account for losses of dopant to walls or to the exhaust pump port. By way of example, the helium or argon gas of the inert gas is introduced at a flow rate of from about 500 sccm to about 1500 sccm, whereas the dopant-containing gas is introduced at a rate of, for example, 15-50 sccm (e.g., 28 sccm). Further, the dopant-containing gas can include a diluted amount of the dopant and can include, for example 0.7% of the dopant such as $AsH_3$ or $PH_3$, with the remainder an inert gas such as He or Ar. Thus, throughout an entire process of doping, which can occur, for example over 30-60 seconds, only a small amount of the dopant itself is actually injected into the chamber, for example, about 0.5 (or less) to 3.0 standard cubic centimeters (or 0.5 to 3 sccm) of the dopant gas for (or throughout) the entire process. In terms of the total gas mixture (including both the inert gas and the dopant-containing gas), the dopant compound (e.g., $AsH_3$ or $PH_3$) can be, for example, about 0.01% to 0.1% of the total mixture or total gas flow. Additional elements can also be included in the inert gas or the dopant containing gas depending upon the process recipe. For example, additional hydrogen can also be provided in the gas mixture (e.g., 1-3 sccm), by being introduced with the dopant containing gas or the inert gas. Gases are exhausted from the chamber by a suitable pump, with the exhaust represented by arrow E.

Ideally, the dopant provides the dose equivalent of a monolayer of dopant formed on the substrate, particularly on structures of the substrate such as Fin-FETs or on the order of $10^{15}$ atoms/cm². The process time can be about 30-60 seconds, more typically about 40-60 seconds. The flux of dopant atoms, for example As, can be $10^{13}$-$10^{14}$ atoms per square centimeter per second. The total ion flux can be on the order of $10^{15}$-$10^{16}$ ions per square centimeter per second. Thus, the majority of the ions in the plasma are non-dopant ions, such as helium ions. As a result, during the initial portion of the process, amorphization or randomizing of the silicon surface will occur first, followed by dosing and saturation with the dopant, as will be discussed in further detail hereinafter.

A mixing and/or switching arrangement is illustrated at 34 in FIG. 1. If the gases are previously mixed, the arrangement 34 can be a switching arrangement to control switching of the flow (or the proportion of the flow) from the central port 26 to the peripheral ports 27 in an alternating fashion as the process proceeds. If the gases are not previously mixed, the arrangement schematically represented at 34 can include a mixing arrangement and also a switching assembly. The gas flows and switching are controlled by a controller represented at 36. In the illustrated example, two gas supply sources are provided 30, 32, one providing a source of the inert gas, and the other a source of the dopant containing gas (the dopant compound, e.g., arsine or phosphine diluted with a carrier gas such as helium or argon).

If desired, the concentration or proportion of the dopant gas relative to the inert gas can vary for the center injection as compared with when the mixture is injected at the periphery. However, so as to avoid unduly complicating the apparatus and control thereof, the same gas mixture can be utilized, with the flow alternating from primarily being at the center injection port during a first period to being primarily through the peripheral ports during a second period of time, and with the flow continuing to alternate as the process progresses.

Figure 2:
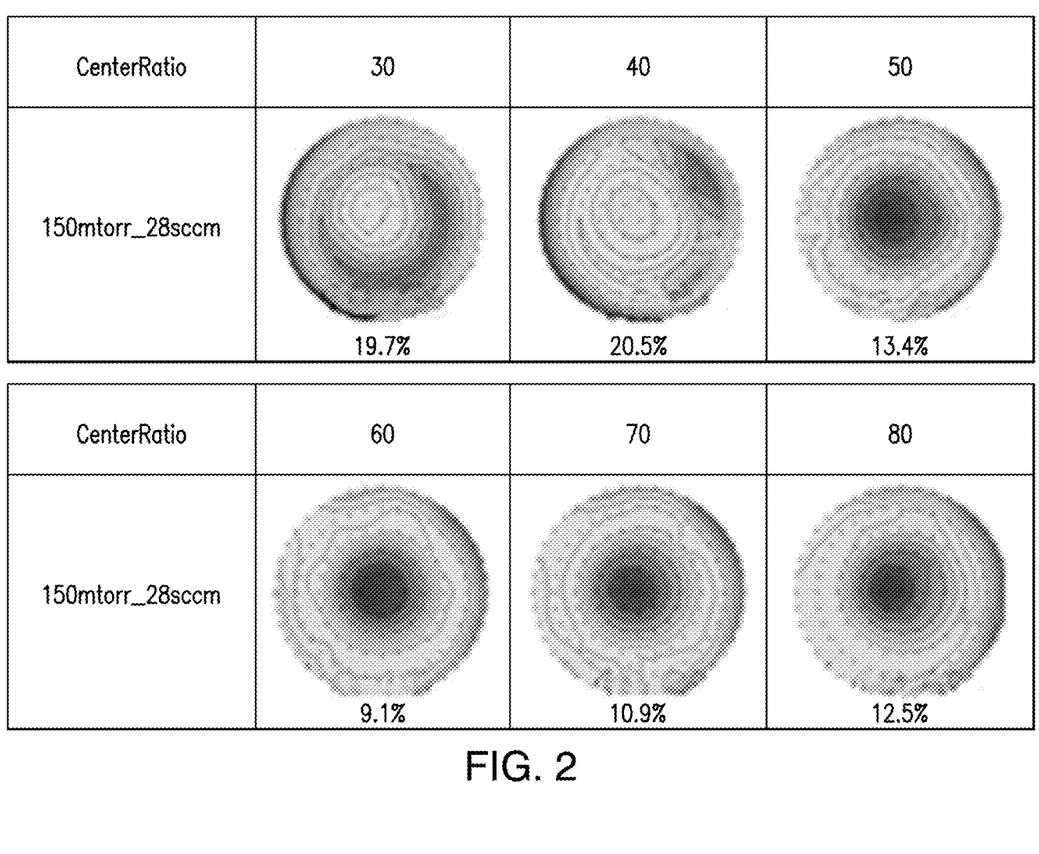
FIG. 2 illustrates variation in resistivity across a wafer for various ratios (or percentages) of center to periphery gas introduction, where the ratio is fixed throughout the process.

The flow is preferably not entirely discontinued in the central port 26 when the flow is primarily through the peripheral ports 27. Similarly, the flow is preferably not entirely discontinued from the peripheral ports 27 when the flow is primarily through the central port 26. This is to avoid problems that could occur, for example, if backflow should occur from the processing space 12 back into the ports when the flow is primarily through other ports. However, as discussed in further detail hereinafter, when the flow is switched, the large majority of the flow is through either the central or peripheral ports, at least 80% of the total flow, more preferably over 90% of the total flow, and even more preferably over 95% of the total flow. For the ports which are not being used as the primary inject location at a given time, the flow can be just sufficient to prevent backflow. To prevent backflow, an inert gas (without the dopant containing gas) could be used, or alternatively, the same mixture being supplied to the primary injection location can be used Tests were conducted with static ratios of flow amounts or percentages of the total flow in the center as compared with the peripheral ports. However, the same percentage or ratio was maintained throughout the doping process. For example, processes were conducted in which 30% of the flow passes through the central port with 70% of the flow through the peripheral ports, and with this ratio maintained throughout the process. Additional tests were conducted with different percentages or ratios between the edge and central flow maintained throughout the process. The surface sheet resistivities (after plasma doping and annealing) across the wafer were then measured to reflect doping and process uniformity. Results are shown in FIG. 2, in which the number above the wafer represents the percentage of the total flow injected through the central port throughout the process. FIG. 2 schematically represents resistivity measurements on the resulting wafers, which are inversely proportional to the amount of activated dopant. The percentage number at bottom of each wafer is an indication of uniformity of surface resistively. A lower percentage reflects better uniformity. The lines within each wafer represent regions of different resistivities.

A high proportion of center gas injection leads to a bull's-eye effect or to sheet resistance profiles having a low resistivity focused in the center of the wafer as represented by the wafers in the bottom row of FIG. 2. This effect is related to a large dopant flux at the center from the center gas injector.

Transitioning from center injection to edge injection results in sheet resistance gradually increasing due to decreased dopant production (that is, shorter local residence time of the dopant precursor because edge injectors are located near the pumping port and decreased dopant production rate as the plasma density is typically lower near the chamber edge). With gas injection being predominantly edge injection, the sheet resistance at the edge is decreased relative to the center due to the proximity of the dopant flux source to the edge of the wafer. Note that sheet resistance uniformity may not be due to dopant flux alone but may also be influenced by the flux of other species to the wafer, including precursor dissociation byproducts (e.g., hydrogen) or material from the chamber walls or other chamber parts (e.g., oxygen or silicon) or feed gas (e.g. ions, fast neutrals), or wafer borne by-products such as re-deposited silicon or doping species. The ultimate sheet resistance is impacted further by the potential for dopants to cluster at high dose. Clusters are undesirable as they are typically lost during annealing as they are volatile at typical annealing temperatures and electrically inactive.

Fluxes can be strongly impacted by the flowfield. The condition for the flowfield can be the dominant factor when the product of the sticking coefficient and the thermal velocity are on the order of, or less than, the characteristic chamber length divided by the residence time.

As can be seen in FIG. 2, as the proportion increases with a larger percentage of the mixture injected in the center, the uniformity begins to improve up until about 60% center injection. However, the uniformity then begins to decrease again as the center injection increases to about 80%. In addition, as the amount injected in the center increases, the bull's eye effect becomes particularly noticeable, with the central portion of the wafer having a concentrated region with a lower resistivity (higher amount of dopant).

Figure 3:
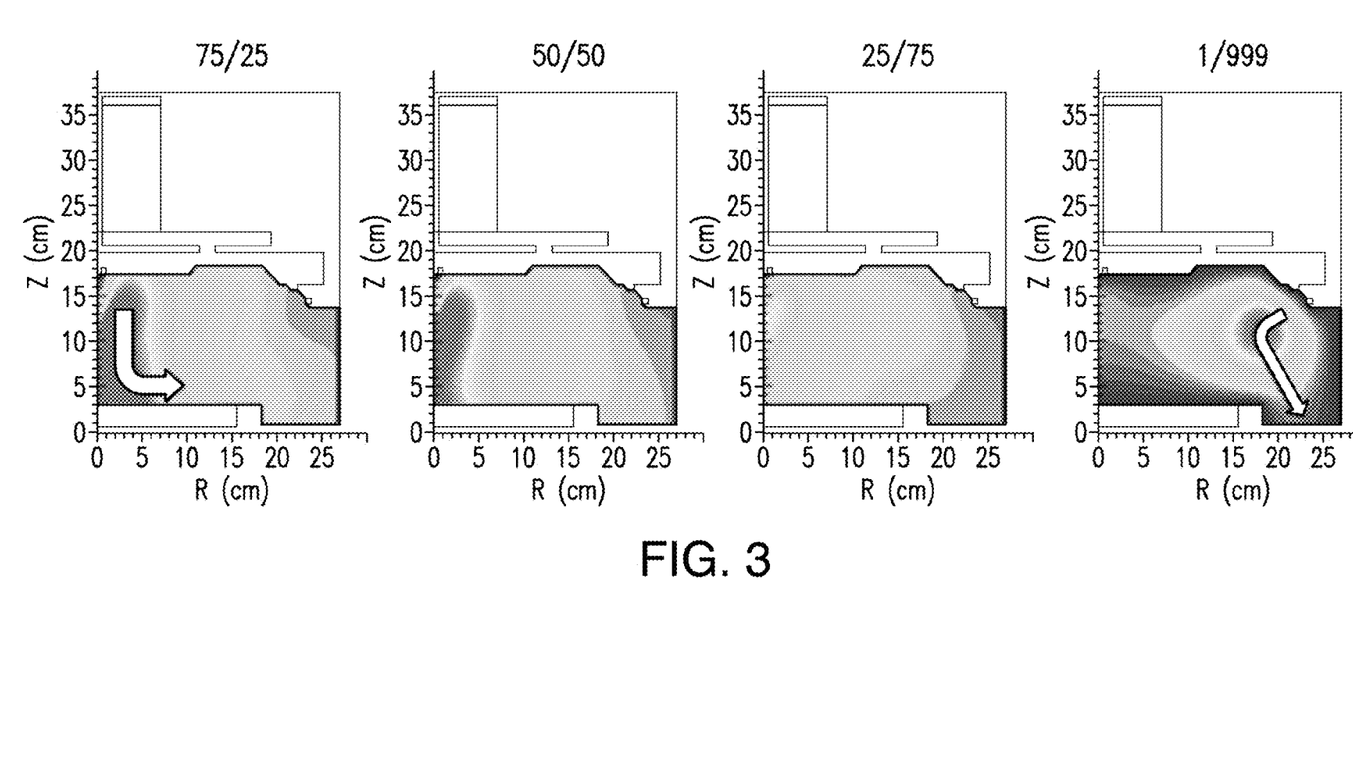
FIG. 3 illustrates a modeling of gas dissociation within a chamber for different ratios or proportions of center to edge flow.

As noted above, the dopant distribution can also be strongly influenced by fluid mechanics effects. Rapid production of dopant precursors near the injector and/or transport of contaminants to the wafer by the same fluid mechanics pathway tend to determine where dopant species will arrive on the wafer. Typically, residence time refers to average residence time or average amount of time gas or ions will be present in a chamber (which will depend upon the chamber size or geometry, pressure and gas flow rate or velocity). However, one must also consider local residence time here, because with the flow from the edge or periphery, the geometry is different than for center injection. For example, the gas mixture injected at the periphery is closer to the exhaust, and moreover, if the gas is also being injected from the center at the same time, this center flow is also flowing toward the exhaust. The diagram of FIG. 3 shows a modeling of the dopant distribution in the chamber by altering center-to-edge flow (e.g., 75/25 in the left-most illustration means 75% of the flow is at the chamber center and 25% of the flow is at the chamber edge). The illustrations of FIG. 3 represent one-half of a chamber (in other words, the left of each illustration is the chamber center, with the right of each illustration representing the side wall) to illustrate the radial distribution of dopant species. As can be seen from the left most illustration (75% center flow), the dopant is concentrated in the center of the chamber. Although the concentration becomes less focused as the center injection decreases, even the 25/75 illustration (25% center injection, 75% edge) reflects a lack of a correspondingly significant impact from the side injection in terms of dopant contribution. When substantially all of the dopant flows from the side, a significant dopant contribution becomes apparent, reflecting the most notable effect of the side injection occurs where at least 80% of the flow is from the side.

Thus, for periphery or edge injection to be effective, it should be a significant majority of the flow, for example at least 80% of the flow. However, if such a flow rate is maintained throughout the process, poor uniformity results as discussed above in connection with FIG. 2. Thus, the present invention utilizes an alternating flow in which, during a first period, flow is primarily from the center, and during a second period, the flow is primarily from the periphery. In addition, during the time at which the flow is primarily in the center or primarily in the periphery, the flow is at least 80% of total flow, more preferably at least 90% of the total flow, and even more preferably at least 95% flow. As discussed earlier, in the presently preferred form, the flow is not entirely discontinued during either period of time, so as to avoid problems, for example, associated with backflow of the plasma. However, for the ports through which the flow is not primarily directed during their respective periods of time, the flow is preferably kept to a minimum, for example, just sufficient to avoid backflow or accumulation of deposits. If flow is to be completely discontinued when a given port is not a primary inject location, other expedients could be used to prevent backflow, e.g., a mechanical closure or cover.

The flux of other species impacting the net dopant distribution on the wafer and Rs (sheet resistance) or Xj (junction depth) on a fin can be similarly impacted by flow field. Center-edge modulation or switching, in accordance with the invention, provides a valuable tool by which to adjust the properties of devices across the wafer so that dopant profile distribution becomes substantially uniform and so that deviations from uniformity are controllable. An additional advantage to uniformity provided by the switching is that it provides better uniformity with respect to elements for which a chamber part is the source during processing (e.g., oxygen and/or silicon). Such center-edge modulation techniques can be applied to slotted antennas, or more generally microwave driven plasma doping systems as well as other plasma doping systems. Techniques can include adjusting center/edge gas injection ratios. Such ratios can be gas amounts or gas alternating time periods (duty cycle). Injector location and spacing can be adjusted, as well as pressure adjustment. It would also be possible for more than two sets of injectors to be rastered in predetermined sequences.

The plasma can be formed using a microwave-based plasma doping apparatus (such as slotted antenna and/or surface wave plasma systems) for various dopants, such as phosphine and arsine dopants. As noted earlier, other dopants or dopant gases could be used, e.g., various arsenic, phosphorous or boron based fluorides or hydrides, as well as cluster ions. Using a plasma doping system, flow of process gasses alternates (switches) between a central injector(s) and side edge or peripheral injectors.

In accordance with the preferred method of the invention, plasma doping is performed using gas switching (center to edge) preferably at pulse speeds on the order of the gas residence time (here, residence time is used in the ordinary sense to mean average residence time) or multiples thereof (Hertz order) to eliminate, or smooth patterns and enhance uniformity to provide a conformal doping layer. As noted earlier, switching speeds can be on the order of 0.5 to 10 seconds, however, slower switching speeds could also be used, even on the order of 15-30 seconds. A slower switching speed can have the benefit of decreasing surface resistivity, while a faster switching speed can promote uniformity.

Switching can be switching from center injectors to edge injectors, or modulation between different center-edge weighted flow rates. Different gas combinations can be injected center-edge. For example, an oxygen source or silicon source can be injected at the wafer edge (or wafer center) in combination with a doping precursor (such as phosphine or arsine) to manage factors that influence the center to edge variation of Rs (sheet resistance) and Xj (junction depth). Flow schemes can be tailored to specific plasma doping recipes and chemistries to optimize deposition. For example, if the flux of dopants is too high, clusters can form among dopant species or between dopant and oxides, which can become volatile and sublime during the anneal step(s). If the flux is too low then not enough dopant will be added to yield a properly functioning device.

The addition of hydrogen and oxygen can be beneficial. Hydrogen can beneficially impact dopant transport. Oxygen and re-deposited silicon can function like a passive cap. A supersaturated dopant layer can contain significant amounts of oxygen, but the oxygen can be lost during the anneal, but behave like a cap during processing. Thus, techniques can also include managing delivery of oxygen and hydrogen.

Although oxygen can be provided as part of the gas mixture delivered to the central or peripheral injection ports, sufficient oxygen can also be provided by utilizing a chamber having parts which provide a source of oxygen. Chamber parts can also provide a source of silicon during processing. For example, the chamber wall can be coated with yttrium oxide which is beneficial as a chamber part coating, and which also can provide a source of oxygen for the process. In addition, certain chamber parts can be formed of silica, for example a silica window, or possibly a focus ring, which can also provide a source of oxygen and also silicon. Thus, oxygen and silicon can be utilized with the process without being provided in the gas mixture. In addition, the supply of additional hydrogen can be controlled, for example, by providing hydrogen with the dopant-containing gas.

It is to be understood that numerous variations are possible within the scope of the present invention. For example, the gas mixture can be different for the center injection as compared with the injection through the peripheral or edge ports (for example with a different percentage of the dopant-containing gas used when the center port is the primary injection location as compared with the percentage when the peripheral ports are used for the primary injection, or with different additives or additive amounts such as oxygen used for the center compared to the peripheral). Presently, for simplicity of design and process control, the same gas mixture can be utilized, with the primary injection location switching between the center and the periphery.

Also, by way of example, the division of the flow rates need not be the same where the center port is the primary injection location as compared with the peripheral ports. For example, where the center port is the primary injection location a certain percentage of the total flow can be fed through the center port with the remainder to the periphery, and after switching, a different percentage (i.e., different than the percentage to the center when the center is the primary inject location) of the total flow could be utilized where the peripheral ports are the primary injection location with the remainder to the center. According to a presently preferred form, the large majority of the flow is directed to the port which is primarily utilized at a given time (e.g., 90 or 95% or more of the total flow or more), and the flow through the non-primary ports is sufficient simply to prevent backflow, with the primary port or ports switching from the center to the periphery or edge.

In accordance with another variation, the increased flow from the peripheral ports could begin before the flow from the center is discontinued (or dropped to a small amount of 20% or less of the total flow, more preferably 10% or less, and even more preferably 5% or less of the total flow). With this variation, after the flow has been injected through the central port for a first period of time, the flow is increased to the peripheral ports for a second period of time, but this increase occurs before the discontinuing (or dropping to a small value) of the central flow. After the flow to peripheral ports has been increased, the flow to the central port is then discontinued or dropped to a small amount. Similarly, in switching the flow back to the central port, the flow is increased at the central port, and thereafter, the flow from the periphery is discontinued or reduced to a small amount. Thus, with this variation, there can be overlapping periods of increased flows (or high flow rates) from both locations, together with alternating periods in which the flow is primarily from either the center or the periphery. In addition, flows can be ramped up or ramped down in the embodiments herein, or they can be changed in single or plural step-wise changes.

Although gas flow can be alternated between center and edge ports, in most plasma systems there should be some minimum flow through both/all nozzles to prevent deposition on the nozzles themselves. In certain plasma systems, a minimum 40-50 sccm of inert gas needs to flow to prevent back-diffusion and deposition. This can be achieved by providing a flow of only inert gas to the ports not being used for the primary injection or, since the flow of the dopant gas is a relatively small percentage of the total flow in the gas mixture, the same gas mixture can be directed through both the central and peripheral ports, but alternating which is used as the primary injection location.

As noted earlier, although FIG. 1 illustrates the edge or peripheral ports extending through the side wall, gas injectors at the edge can alternately be a gas ring at the periphery of the chamber, or can be injectors facing down towards the edge of the wafer near the chamber roof/window, or can be internal injectors (e.g., a gas ring or similar structures). In addition, the peripheral ports can be provided at different radial positions. Baffle plates or screens can be placed in between the wafer and plasma source/injectors or can be combined with the switching apparatus to further alter the flow field.

Figure 4:
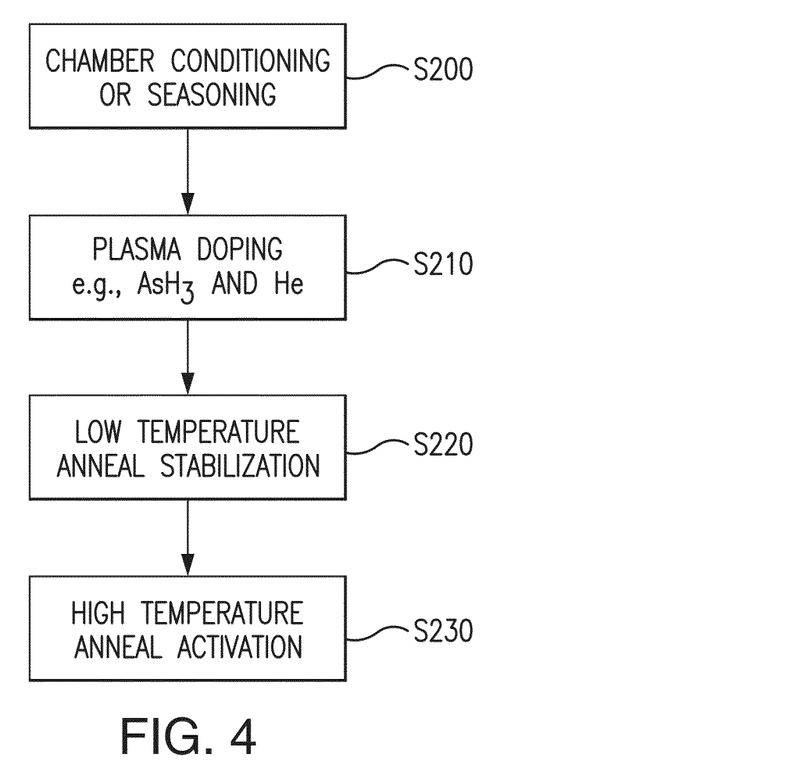
FIG. 4 is a flow chart of an example of a process according to the invention.

FIG. 4 illustrates an overall flow diagram of an example of a process according to the invention. As indicated in step S200, initially the plasma processing chamber is subjected to a wall conditioning or seasoning step. This step is typically utilized only for a new process chamber or after the chamber has been cleaned or serviced. Otherwise this step typically need not be performed. At step S210, the plasma doping process is performed, using for example $AsH_3$ as the dopant gas and He as the inert gas in the illustrated example. As noted earlier, other dopant gases (e.g., $PH_3$) or inert gases (e.g., argon) could be used. It is during this process that the flow is repeatedly switched or alternated from being primarily from the center injection port to being primarily from the peripheral ports. Sub-parts of step S210 are discussed further below in connection with FIGS. 5 and 6.

After the doping, an annealing step is performed to stabilize and activate the doped substrate. Presently, the annealing is performed in a separate chamber dedicated to annealing. However, if desired, it would also be possible to perform the annealing in the same chamber in which the plasma doping process was performed, e.g., by coupling microwaves to the substrate.

In accordance with a preferred annealing, the annealing occurs in two steps. First a low temperature anneal is performed at a first temperature, and thereafter, a second high temperature anneal is performed at a second temperature higher than the first temperature. The first anneal is primarily for stabilization and promotes mixing or alloying of the dopant with silicon of the silicon substrate. The low temperature anneal is also beneficial in preventing (or reducing) the dopant from being removed during the high temperature anneal. The high temperature anneal provides energy so that the dopant is in an electrically active state with silicon. The anneal is preferably a rapid anneal, for example, with each of the first and second steps performed in approximately 3-10 seconds. Also, by way of example, the temperature of the first anneal can be about 650-850° C. The temperature of the second anneal can be, for example, approximately 900-1100° C., e.g., about 1050° C.

In accordance with one of the advantageous features of the invention, by switching or alternating the gas feed during doping, particularly in combination with the remaining process steps, better saturation and uniformity of the doping can be achieved without excess forming of clusters of dopant species on the surface of the substrate. As noted earlier, clusters of the dopant species can be volatile and thus are readily removed during annealing. Other processes therefore often require the application of an additional layer on the top of the doped layer (e.g., a silicon oxide layer) so as to preserve the doped layer during annealing. However, in accordance with present invention, the addition of another protective or "cap" layer is not needed after the doping has been completed (after the flow of the gas mixture for doping has been completed or discontinued, the deposition of an additional layer, such as an additional silicon or silicon oxide layer is not needed).

Figure 5:
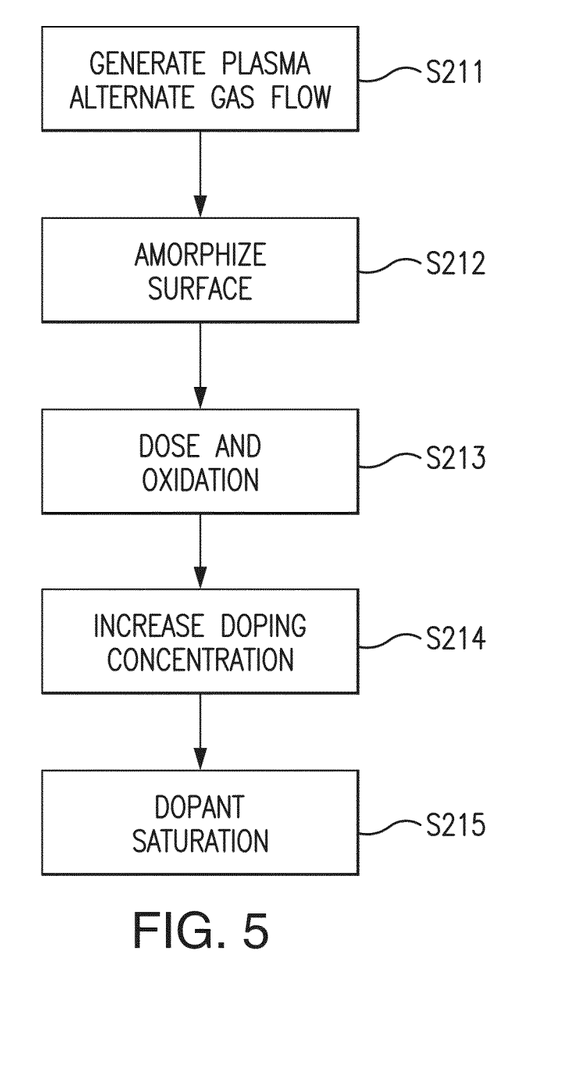
FIG. 5 is a flow chart representing progress of a portion of the process of FIG. 4.
Figure 6:
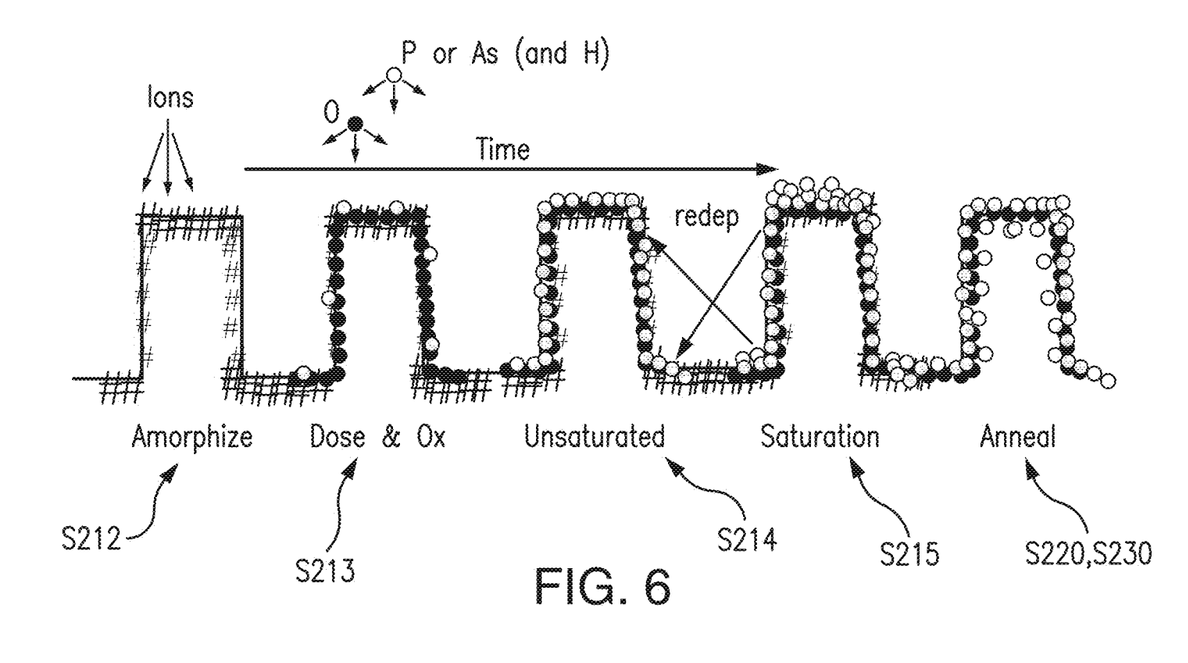
FIG. 6 is a schematic illustration of the progress of an example of a process according to the invention.

Referring to FIGS. 5 and 6, the sub-steps or sub-parts of the process occurring in step S210 of FIG. 4 will be described. First, the plasma process begins by striking or generating a plasma, with the gas flow alternating from being primarily directed from the center port or ports to being primarily directed from the peripheral ports. Other than the switching or alternating of the flow, the process conditions can remain the same throughout the process. By way of example, the temperature of the wafer can be maintained at about 100° C. to 200° C. The pressure can be, for example, about 150-230 mTorr, however, the pressure can be above or below this range. The switching time or the duration of a given period between switching, is preferably in a range of about 0.5-10 seconds, more preferably about 2-10 seconds, and even more preferably about 2-5 seconds. However, the switching time can vary, and benefits of the invention could be realized with even slower switching speeds of, for example, 15-30 seconds. Preferably, a microwave or surface wave plasma is utilized. Excessive ion energy is undesirable as it could cause damage to the surface structures, or result in undesirable penetration of ions excessively deep into the silicon surface. However, sufficient ion energy is needed to amorphize or randomize the substrate surface (discussed below). Preferably, an RF energy bias is also applied to the lower electrode or substrate support. The present arrangement in which microwave energy is utilized to strike and maintain the plasma, with an RF bias to the lower electrode provides sufficient ions and ion energies, without excessive ion energies. By way of example, the microwave power can be 1 kW to 10 kW, and preferably about 3-5 kW, however other power levels could be used. The power density on the antenna can be, by way of example, 1 W/cm$^2$ to 10 W/cm$^2$ for a planar radial line slotted antenna. The RF power can be, for example, 100-750 W, however, other power levels could be used, and it would also be possible to eliminate the RF bias power supply to the lower electrode or substrate support. The RF power to the substrate support can be, for example, 13.56 MHz, however, other frequencies could be used. The frequency for generating the plasma could also be, for example, 800 MHz to 10 GHz.

A plasma is needed for sufficient ions in the initial phase to amorphize or randomize the surface of the substrate which is to be doped. This is illustrated in step S212 of FIG. 5, and also is illustrated in the amorphize portion S212 of FIG. 6. This occurs, for example, in the first 1-2 seconds of the process. Here, ions from the plasma bombard the surface of the substrate and the structures formed thereon (fin structures as illustrated). The helium ions (or ions of another inert gas such as argon), primarily cause the amorphization, as the ions of dopant are relatively few and thus, by themselves, would not be sufficient to amorphize the surface.

After the surface is amorphized, a dose and oxidation of the surface occurs (up until approximately 3-10 seconds after the start of the process, for example), during which dopant species also begin to be deposited upon the surface as shown in step S213 (FIGS. 5 and 6). In the illustration of FIG. 6, the dark or solid dots represent silicon or oxygen atoms, and the white or open dots represent dopant atoms. In this step S213, silicon and oxygen also form a small layer on top of the substrate to form an Si—Ox or Si—Ox-D (D for dopant) layer on the topmost surface. This topmost layer can provide a number of benefits including: (1) it promotes forming of an interlayer of the dopant just below the topmost layer as the dopant tends to accumulate adjacent this topmost layer, with the topmost layer thus both preventing the dopant from escaping from the substrate and also preventing the dopant from penetrating too deeply into the substrate, and (2) particularly since dopant clustering is minimized or avoided with the invention, this topmost layer can be sufficient to prevent sublimation of the dopant during annealing. As noted earlier, some processes provide an additional capping layer after doping to prevent escape of the dopant during annealing. According to one of the benefits of the invention, such an additional capping layer need not be formed. Of course, if desired, the present invention could also be practiced in combination with the use of an additional capping layer. However, the invention can be practiced without an additional layer after doping, and the small topmost layer formed during doping is sufficient to protect the dopant during annealing (during which the topmost layer is removed). Although oxygen could be introduced with the gas mixture to provide an oxygen source for oxidation, existing chamber parts (or the selection of chamber parts/materials) can provide a sufficient source of oxygen as discussed earlier, for example, from a yttrium oxide coating on the surface of the chamber parts and/or from silica parts within the chamber (which can also provide a source of silicon).

In step S214, the amount of dopant deposited is increasing, but remains unsaturated, and the deposition of the dopant continues to increase over approximately the remainder of the process until at step S215, the surface is saturated. As illustrated in FIG. 6, as the dopant amount is increasing, the dopant deposition occurs not only by deposition of the dopant species directly from the plasma, but also from re-deposition occurring, for example, from the bottom of the trench to the walls of the fin structure.

After the dopant is saturated upon the surface of the substrate, the doping process is complete. The overall process occurs in approximately 30-60 seconds, and more typically over approximately 40-60 seconds. Thereafter, the substrate is annealed, preferably with a two step anneal as discussed earlier.

The invention can be particularly advantageous in doping FinFET devices; however, the invention can also be applied to other applications. For example, the invention could be used in doping vertical NAND Flash memory structures, CMOS image sensors, or in erbium doping. The invention can thus be used with various devices or structures, including structures that are not planar and do not possess topographies normal or parallel to the substrate. Examples of these structures include image senors, photonic devices with raised cyclindical structures, silicon nanowires or gate structures with recesses.

As should be apparent from the foregoing, the invention provides an advantageous method and apparatus for doping a substrate. It is to be understood that variations are possible within the scope of the appended claims, and therefore, the invention can be practiced otherwise than as specifically described herein.

The invention claimed is:

1. A method for plasma processing comprising:
    loading a substrate into a plasma processing chamber and placing the substrate on a substrate holder, the plasma processing chamber having a top wall opposing the substrate holder, and a peripheral wall surrounding the substrate holder;
    forming a plasma in the plasma processing chamber;
    introducing a first gas mixture, for a first time period, at a first flow rate, into the plasma processing chamber, from at least one gas injection port located in a top central region of the plasma processing chamber, the first gas mixture comprising a dopant species;
    following the introduction of the first gas mixture, introducing a second gas mixture, for a second time period, at a second flow rate, into the plasma processing chamber, from at least one gas injection port located in a peripheral region of the plasma processing chamber, the second gas mixture comprising the dopant species, wherein during at least a portion of the second time period the second flow rate is at least 80% of a total flow rate from both the at least one gas injection port located in the top central region and the at least one injection port located in the peripheral region;
    repeating the steps of introducing the first gas mixture and introducing the second gas mixture, to form a layer of dopant species on structures on the substrate.

2. The method of claim 1, wherein the plasma processing chamber comprises a microwave plasma source which forms the plasma.

3. The method of claim 2, wherein the plasma source is a slotted antenna plasma source or surface wave plasma (SWP) source.

4. The method of claim 1, wherein the dopant species comprises at least one of As, P or B.

5. The method of claim 1, wherein the first gas mixture and second gas mixture each contain at least one of helium or argon fed at a flow rate of from about 500 sccm to about 1500 sccm, and wherein the first and second gas mixtures each further include a dopant containing gas fed at a rate of about 10% or less of the total gas flow of the respective first mixture and the second mixture, and wherein the dopant containing gas comprises at least one of arsine, phosphine, or borine;
    wherein the duration of each of the first time period and the second time period is from 0.5 to 10 seconds;
    wherein during introduction of the first and second gas mixtures, the substrate is maintained at a temperature of about 200° C. or less; and
    wherein the structures on the substrate include a plurality of Fin-FET, and wherein the layer of dopant species is formed on the Fin-FET.

6. The method of claim 1, wherein during the first time period at least 90% of the total flow rate enters through the at least one gas injection port located in the top central region of the plasma processing chamber, and wherein during the second time period at least 90% of the total flow rate enters through the at least one gas injection port located in the peripheral region of the plasma processing chamber.

7. The method of claim 6, wherein the first gas mixture and second gas mixture comprise at least one gas selected from the group consisting of helium and argon, and wherein the dopant species comprises at least one of arsine or phosphine.

8. The method of claim 7, wherein the plasma is formed using a microwave power source and the plasma is maintained during the first period and the second period using the microwave power source.

9. The method of claim 6, wherein first gas mixture comprises at least one of helium or argon, and wherein the first gas mixture further comprises at least one of $PH_3$ or $AsH_3$ in an amount of from 0.01% to 0.1% of the total flow of the first gas mixture, wherein the second gas mixture comprises at least one of helium or argon, and wherein the second gas mixture further comprises at least one of $PH_3$ or $AsH_3$ in an amount of from 0.01% to 0.1% of the total flow of the second gas mixture.

10. The method of claim 9, wherein the first time period and second time period each have a duration of from about 0.5 to 10 seconds.

11. The method of claim 10, wherein the first time period and second time period each have a duration of from about 2 to 10 seconds.

12. The method of claim 1, wherein the first time period and second time period each have a duration of from 0.5 to 10 seconds, and wherein the total process time including repeating the steps is from about 30 to 60 seconds.

13. The method of claim 1, further comprising:
    annealing the substrate after discontinuing introduction of the first and second gas mixtures.

14. The method of claim 1, wherein the substrate holder is RF-biased with an RF power source coupled to the substrate holder.

15. The method of claim 1, wherein during the introduction of the first and second gas mixtures, the substrate is maintained at a temperature of about 100 to 200° C., and further wherein each of the first and second gas mixtures comprise:
    (i) at least one of helium or argon fed at a flow rate of from about 500 sccm to about 1500 sccm; and
    (ii) a dopant containing gas fed at a flow rate of from about 15 sccm to about 50 sccm, and wherein the dopant containing gas comprises about 2% or less of at least one of $PH_3$ or $AsH_3$.

16. A method for plasma processing comprising:
    loading a substrate into a plasma processing chamber and placing the substrate on a substrate holder, the plasma processing chamber having a top wall on a side of the plasma processing chamber opposing the substrate holder, and a peripheral wall surrounding the substrate holder;
    forming a plasma in the plasma processing chamber using at least one of microwave energy or a surface wave plasma source;
    introducing a first gas mixture, for a first time period, at a first flow rate, into the plasma processing chamber, from at least one gas injection port located on the top wall of the plasma processing chamber and located proximate a center of the substrate, the first gas mixture comprising a dopant species;
    following completion of the first time period, introducing the first gas mixture, for a second time period, at a second flow rate, into the plasma processing chamber, from at least one gas injection port located proximate a periphery of the substrate, wherein during at least a portion of the second time period the second flow rate is at least 80% of a total flow rate from both the at least one gas injection port located on the top wall of the plasma processing chamber and located proximate the center of the substrate and the at least one gas injection port located proximate the periphery of the substrate;

repeating the steps of alternating introducing of the first gas mixture from the location proximate the center of the substrate and introducing the first gas mixture from the location proximate the periphery of the substrate such that a layer of dopant species is formed on structures on the substrate.

17. A method according to claim 16, wherein the first gas mixture comprises an inert gas introduced at a flow rate of from about 500 sccm to about 1500 sccm, and wherein the first gas mixture further includes a dopant containing gas introduced at a flow rate of about 15 sccm to about 50 sccm;

wherein the first time period and the second time period each have a duration of from about 0.5 to 10 seconds.

18. A method according to claim 17, wherein the dopant containing gas comprises at least one of $AsH_3$ or $PH_3$ present in an amount of about 2% or less of the dopant containing gas; and wherein the structures on the substrate include a plurality of Fin-FET and the layer of dopant species are formed on the Fin-FET.

19. A method according to claim 18, wherein the method includes applying an RF power to the substrate holder during at least a portion of the first time period and the second time period; and wherein the method further includes annealing the substrate after discontinuing feeding of the first gas mixture and extinguishing the plasma.

20. A method according to claim 19, wherein the annealing comprises:

annealing the substrate at a first temperature; and annealing the substrate at a second temperature after the annealing at the first temperature, and wherein the second temperature is higher than the first temperature; and wherein the method further includes performing the annealing at the first temperature without forming a further layer on the substrate after forming of the dopant layer using the first gas mixture.

* * * * *